United States Patent [19]

Schuetz

[11] Patent Number: 4,857,418
[45] Date of Patent: Aug. 15, 1989

[54] RESISTIVE OVERLAYER FOR MAGNETIC FILMS

[75] Inventor: James A. Schuetz, Maple Grove, Minn.

[73] Assignee: Honeywell Inc., Minneapolis, Minn.

[21] Appl. No.: 939,315

[22] Filed: Dec. 8, 1986

[51] Int. Cl.$^4$ ............................................. G11C 11/15
[52] U.S. Cl. ................................... 428/693; 365/158; 365/173; 428/457; 428/662; 428/678; 428/699; 428/704; 428/900
[58] Field of Search ............... 428/660, 662, 668, 678, 428/681, 680, 688, 689, 692, 693, 694, 698, 699, 900, 704, 457; 365/8, 126, 32, 158, 164; 323/294, 368; 324/252; 360/113

[56] References Cited

U.S. PATENT DOCUMENTS

| | | |
|---|---|---|
| 3,015,807 | 10/1957 | Pohm et al. . |
| 3,125,743 | 3/1958 | Pohm et al. . |
| 3,160,863 | 12/1964 | Partoui et al. ...................... 365/158 |
| 3,375,503 | 12/1964 | Bertelsen . |
| 3,452,334 | 12/1964 | Voegeli . |
| 3,466,632 | 12/1966 | Wang . |
| 3,484,756 | 5/1967 | Voegeli . |
| 3,524,173 | 5/1967 | Wolf . |
| 3,525,023 | 8/1969 | Pollack . |
| 3,587,069 | 11/1969 | Goto . |
| 3,623,038 | 12/1969 | Franklin et al. . |
| 3,701,931 | 10/1972 | Revitz et al. ........................ 428/641 |
| 3,701,983 | 10/1972 | Franklin et al. . |
| 3,864,751 | 2/1975 | Beaulieu et al. ..................... 360/113 |
| 3,908,194 | 9/1975 | Ramankin ............................ 360/113 |
| 3,996,575 | 12/1976 | Battarel . |
| 4,079,360 | 3/1978 | Ookubo et al. . |
| 4,097,802 | 6/1978 | Mahopac . |
| 4,208,725 | 6/1980 | Paul et al. . |
| 4,356,523 | 10/1982 | Yeh ........................................ 365/158 |
| 4,470,873 | 9/1984 | Nakamura ............................ 365/32 |
| 4,503,394 | 3/1985 | Kawakami et al. ................. 360/113 |
| 4,504,552 | 3/1985 | Kim ...................................... 428/662 |

FOREIGN PATENT DOCUMENTS

| | | | |
|---|---|---|---|
| 0033399 | 3/1978 | Japan ....................................... 365/8 |
| 0123183 | 9/1980 | Japan ....................................... 365/8 |
| 0763964 | 9/1980 | U.S.S.R. ................................. 365/8 |

OTHER PUBLICATIONS

J. M. Daughton et al., IBM Technical Disclosure Bulletin, vol. 8, No. 11, Apr. 1966, pp. 1613–1614.
J. Berchier et al., Magnetoresistive Switching of Small Permalloy Sandwich Structures, J. Appl. Phys. vol. 55, No. 2, Jan. 15, 1984 pp. 487–492.
Ooyen et al, Magnetoresistance in Laminated Fife Films, J. Appl. Phys. 53(3), Mar. 1982—pp. 2596–2598.
Ahn et al, Fabrication of Contiguoud-Disk Magnetic Bubble Devices, IEEE Transactions on Magnetics, vol. MAG-15, No. 1, Jan. 1980.

Primary Examiner—George F. Lesmes
Assistant Examiner—James B. Monroe
Attorney, Agent, or Firm—W. T. Udseth

[57] ABSTRACT

A magnetic, solid state memory cell or sensor includes a magnetoresistive, ferromagnetic layer and a resistive layer overlying the magnetoresistive layer. The resistivity and dimensions of the resistive layer are such that, preferably, only a small fraction of any sense current flowing through the cell or sensor will flow between input and output contacts by way of the resistive layer, yet the magnitude of the sense current will not be reduced below a desired signal level due to the presence of the resistive layer. The resistive layer is comprised of a material which will not diffuse into the magnetoresistive layer. A compound or mixture of a metal and either nitrogen or oxygen, such as tantalum and nitrogen, is preferred as the resistive layer. It is also preferred that the resistive layer be nonmagnetic.

3 Claims, 5 Drawing Sheets

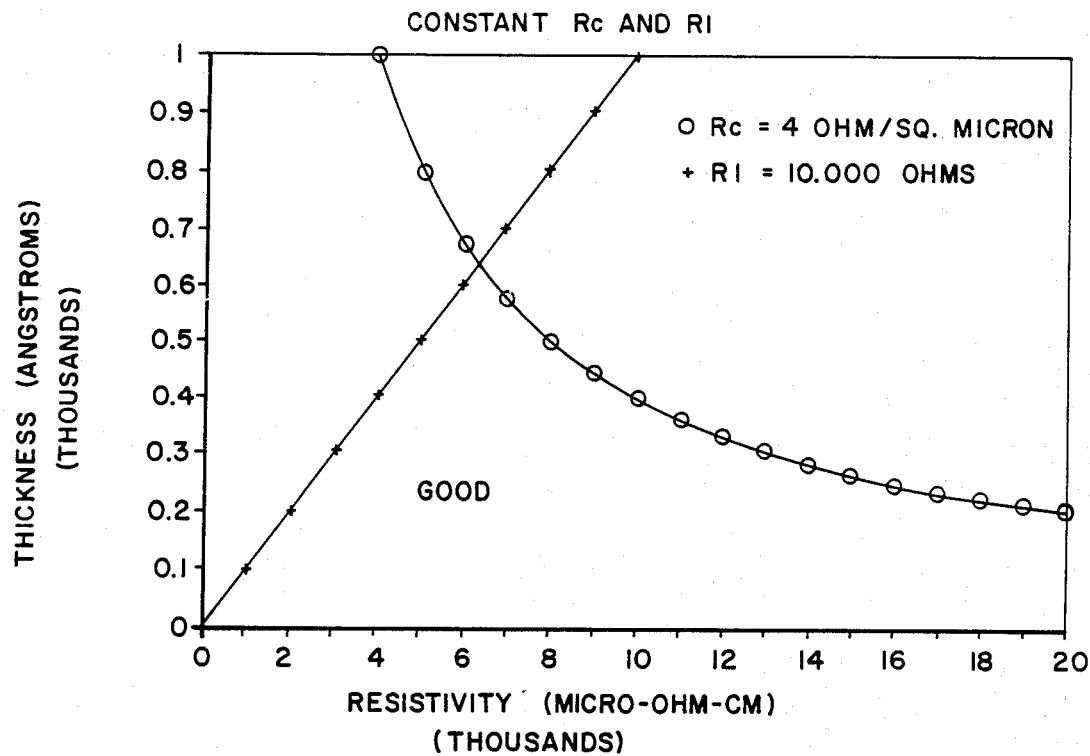
*Fig. 5* (RESISTIVE LAYER)

RESISTIVE OVERLAYER FOR MAGNETIC FILMS

Reference is hereby made to earlier filed copending applications by J. M. Daughton and A. V. Pohm entitled "Magnetic Memory" having Ser. No. 870,068 by J. M. Daughton and J. S. & T. Huang entitled "Magnetic Memory Configuration" having Ser. No. 879,679 and by J. M. Daughton and P. N. Forssell entitled "Magnetic Memory Cell" having Ser. No. 908,075.

BACKGROUND OF THE INVENTION

1. FIELD OF THE INVENTION

This invention relates to magnetic memory cells and magnetic sensor elements wherein a nonmagnetic, resistive layer overlays at least part of a magnetic layer, and wherein the resistive layer is interposed between the magnetic layer and an electrical contact.

2. RELATED ART

Certain magnetic memories and magnetic sensors utilize thin films of ferromagnetic, magnetoresistive materials as key sensing elements.

Ferromagnetic materials are materials possessing permanent magnetic dipoles which exhibit a high degree of alignment at room temperature. The net magnetic moment $\bar{M}$ (or magnetization) of a ferromagnetic material is a measure of the alignment of the dipole moments in the material.

In forming ferromagnetic thin films, the orientation of $\bar{M}$ can be selected by exposing a ferromagnetic material to a unidirectional external magnetic field during deposition or annealing. The resulting uniaxial anisotropic magnetic film has what is referred to as an easy magnetic axis (aligned with the direction of the externally applied magnetic field), and a hard magnetic axis which is perpendicular to the easy axis.

Further, the magnetic thin film is magnetoresistive. That is, the electrical resistance of the film depends upon the orientation of the easy axis relative to the direction of current flow. The maximum resistance occurs when the magnetization vector and the current direction are parallel, and the minimum resistance occurs when they are perpendicular.

In magnetic memories, data storage lines are formed of the above described magnetoresistive thin films. Data is stored in binary fashion by utilizing a magnetic thin film deposited, as distinct cells, along a sense or bit line. The easy axis is often oriented along the bit line. If the magnetization of a cell is in a first direction along the bit line, the bit is defined as a 1; if the magnetization is in a second direction opposite the first direction, the bit is defined as a 0.

A conductive current strap, or word line, is typically disposed orthogonal to and overlaying the bit line. The word line is electrically isolated from the bit line.

The data condition of a cell is sensed or read by passing a sense current through the bit line and a word current through the word line. The magnetic field associated with the sense current interacts with and rotates the magnetization of the thin film within the plane of the thin film to an oblique position with respect to the easy axis. The rotated magnetization vector will be in a different position for a 0 than for a 1. The magnetic field associated with the word current will either increase or decrease the angle of rotation of the magnetization with respect to the easy axis, depending on the logic state of the bit being sensed.

A sense amplifier, connected across the bit line and responsive to the sense current, will detect a different electrical signal for a 0 than for a 1.

A write operation is similar to a read operation except that the magnitude of the sense and word currents are increased so that together the magnetic fields associated with the sense and word currents are sufficient to flip the rotated magnetization vector from one logic state to the other.

Some magnetic memories form the easy axis perpendicular (or transverse) to the longitudinal axis of the bit line. Read and write operation in that case are similar to those of the longitudinal cell.

Some magnetic sensors employ a sense element which is similar in structure to the magnetic memory bit line. That is, a magnetoresistive (ferromagnetic) thin film is formed into a strip having an easy axis. A sense current is passed along the strip. The presence of an external magnetic field due, for example, to current or the movement of a ferromagnetic object, will lead to interaction of the external magnetic field and the magnetization of the thin film strip. The change in resistance of the thin film due to the interaction is sensed by measuring the effect on the sense current.

In both magnetic memories and magnetic sensors, signal levels are typically very small, i.e. on the order of few millivolts or a few milliamps. Thus one must take care not to substantially reduce signal levels when modifying the device structure.

Both the magnetic memory and the magnetic sensor can be formed by thermal and vapor deposition techniques. Selected layers of insulators and metals are grown or deposited, and etched to form a solid state, monolithic device.

In the course of this processing, a magnetoresistive thin film is deposited. For magnetic memories, the thin film is typically deposited as a "sandwich" structure, i.e. first and second ferromagnetic thin film layers separated by a thin intermediate layer. The two ferromagnetic layers have their magnetization vectors antiparallel. The intermediate layer is selected and configured to break the exchange coupling between the two ferromagnetic layers. This sandwich structure results in good "flux closure", i.e. the magnetic field lines due to the magnetization of the sandwich are primarily confined to a closed path within the structure. Flux closure reduces demagnetizing effects due to the presence of free magnetic poles at the film edges and due to other nearby magnetic fields, and is important for the proper functioning of magnetic memories with densely packed cells.

The top ferromagnetic thin film in the sandwich structure is placed in electrical contact with a conductive lead at each end of the bit, so that the ends of adjacent bits can be joined by a good conductor to form a good current path for the sense current.

However, in forming the top ferromagnetic layer in the sandwich, one typically etches through an insulative layer to expose the top ferromagnetic layers and form a via in which the conductive lead will be deposited. Generally, ferromagnetic thin films readily oxidize. Thus exposure of the top thin film during device processing will result in a thin oxide layer on its upper surface, which will alter the electrical characteristics of the contact site in undesirable and often unpredictable ways. Further, since the top thin film is typically less than 1000 Å thick (and often only a few hundred angstroms thick or thinner) it is difficult to control the etching with enough precision to avoid cutting deeply into the top layer or even etching through it. Deep cuts in the upper thin film can substantially adversely affect flux closure, sense current flow and device performance.

Likewise, in the case of a magnetic sensor utilizing either a single thin film ferromagnetic layer (or a sandwich structure similar to magnetic memory bit cells) vias are formed in an overlaying layer to expose the upper surface so that conductive contacts can be made to the film. Oxidation of the upper surface or etching deeply into the thin film cause similar problems in the sensor to those of magnetic memory cells.

Protective layers overlying the magnetic film could be employed, but if the protective layer is a good conductor, it could short out the electrical properties of the magnetic film and reduce the already low signal currents flowing in the magnetic films.

A thin film structure which could protect the magnetic thin film during processing, and afford good electrical contact to conductive leads while leaving sufficient signal levels within the thin film, is thus highly desirable.

SUMMARY OF THE INVENTION

The present invention is a magnetoresistive thin film memory cell or magnetic sensor which includes a ferromagnetic, magnetoresistive, thin film and a resistive material layer overlying at least part of the ferromagnetic thin film. The electrical characteristics and configuration of the resistive material are such that most of the electrical current flowing in the cell or sensor will flow through the magnetic thin film. That is, the resistive material provide high line resistance between electrical contacts to the device but allows for good vertical conduction to the magnetoresistive elements of the structure.

One embodiment of the invention is a magnetic memory cell or magnetic sensor comprising a first and second layer of magnetoresistive, ferromagnetic materials, a third layer interposed between the first and second layers and comprised of a material which will prevent exchange coupling between the first and second layers, a fourth layer of a resistive material overlaying, at least in part, the upper surface of the first layer, with electrical conductive contacts formed at two spaced locations on the top of the resistive layer. The electrical characteristics of the resistive layer are such that less than half of the current flowing between the electrical contacts will flow solely within the resistive material, yet the presence of the resistive layer between the contacts and the upper ferromagnetic layer will not reduce the magnitude of the current flowing in the device below the desired signal level.

A second embodiment of the present invention is a magnetic sensor similar to the first embodiment but the second magnetoresistive, ferromagnetic layer and the third layer are deleted.

Useful materials for the resistive layer are compounds comprised of a metal and either nitrogen or oxygen. In particular, nitrogen doped tantalum is a good material for the resistive layer. The resistive layer is preferably nonmagnetic to minimize demagnetizing effects.

BRIEF DESCRIPTION OF THE DRAWINGS

FIG. 5 is a graph showing plots of acceptable ranges of contact resistance and linear resistance for an examplary embodiment of the present invention.

DESCRIPTION OF THE PREFERRED EMBODIMENTS

Figure 1:
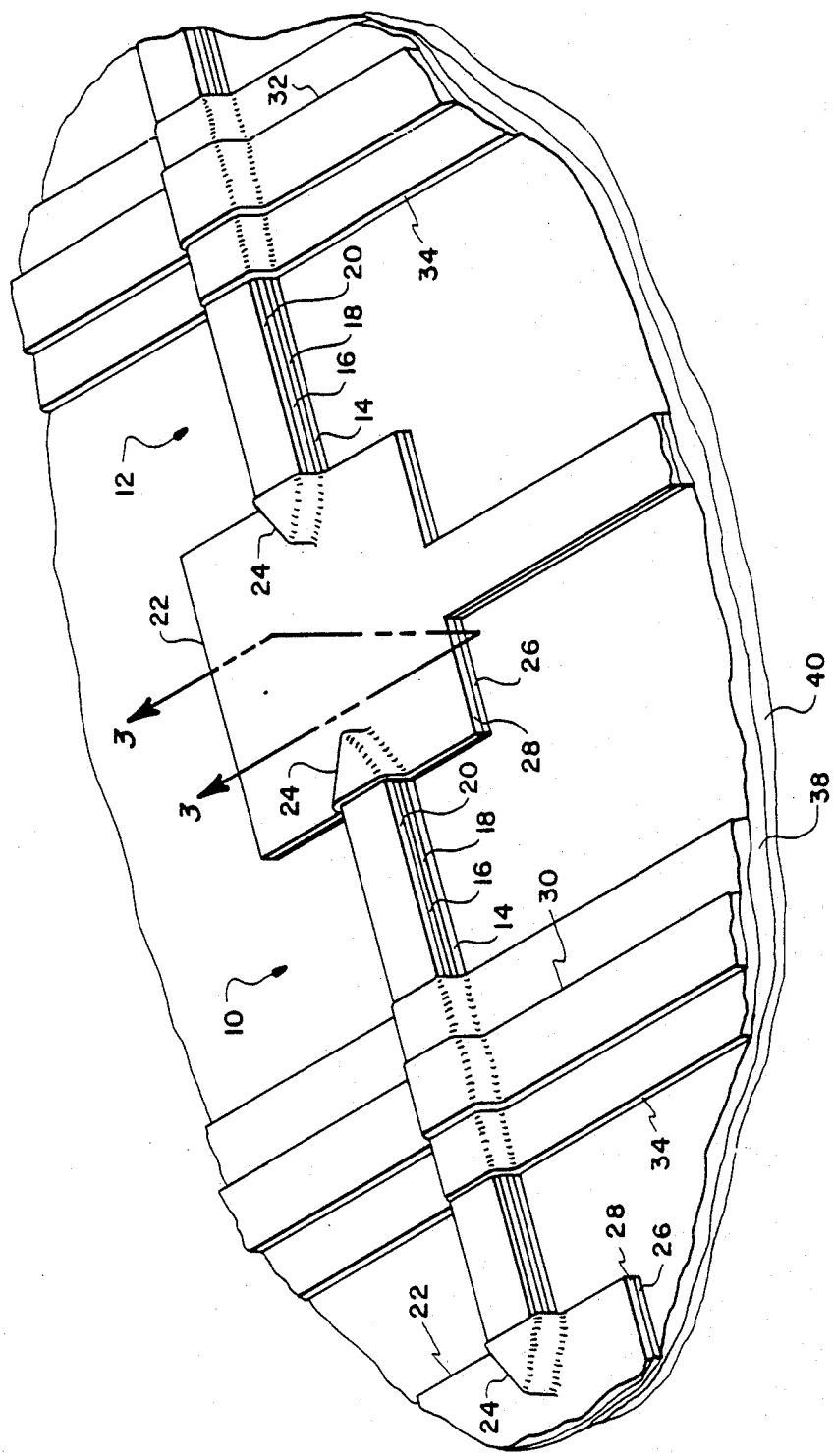
FIG. 1 is a perspective view of a portion of a first magnetic bit cell line which utilizes the present invention.

FIG. 1 depicts a first magnetic, thin film bit cell 10 and a portion of a second such cell 12. Each cell comprises first and second magnetoresistive layers 14 and 16, with an intermediate layer 18 therebetween, and a resistive layer 20 overlying layer 16.

Electrically conductive contacts 22 are formed at the junction of cells 10 and 12. Contacts 22 include a raised portion 24 overlying the tapered ends of the four layer bit cell "sandwich" structure. The underside of raised portions 24 will directly contact resistive layer 20. Contacts 22 are for example, comprised of a barrier metal layer 26 (e.g. TiW) and a conductive upper layer 28 (e.g. AlCu). Barrier metal layer 26 prevents the AlCu from diffusing into resistive layer 20 and magnetic layer 16.

Current straps or word lines 30 and 32 are separated from bit cells 10 and 12, respectively, by insulating layer 34. Layer 34 is shown cutaway for clarity. Layer 34 will in fact cover surface 36 of insulating layer 38. A further insulating passivation layer (not shown) will typically overlay the entire structure shown in FIG. 1.

The above structure is formed on surface 36 of insulating layer 38. Insulating layer 38 is typically a thermally grown layer overlying substrate 40. Substrate 40 may be Si, GaAs or other suitable material.

Figure 2:
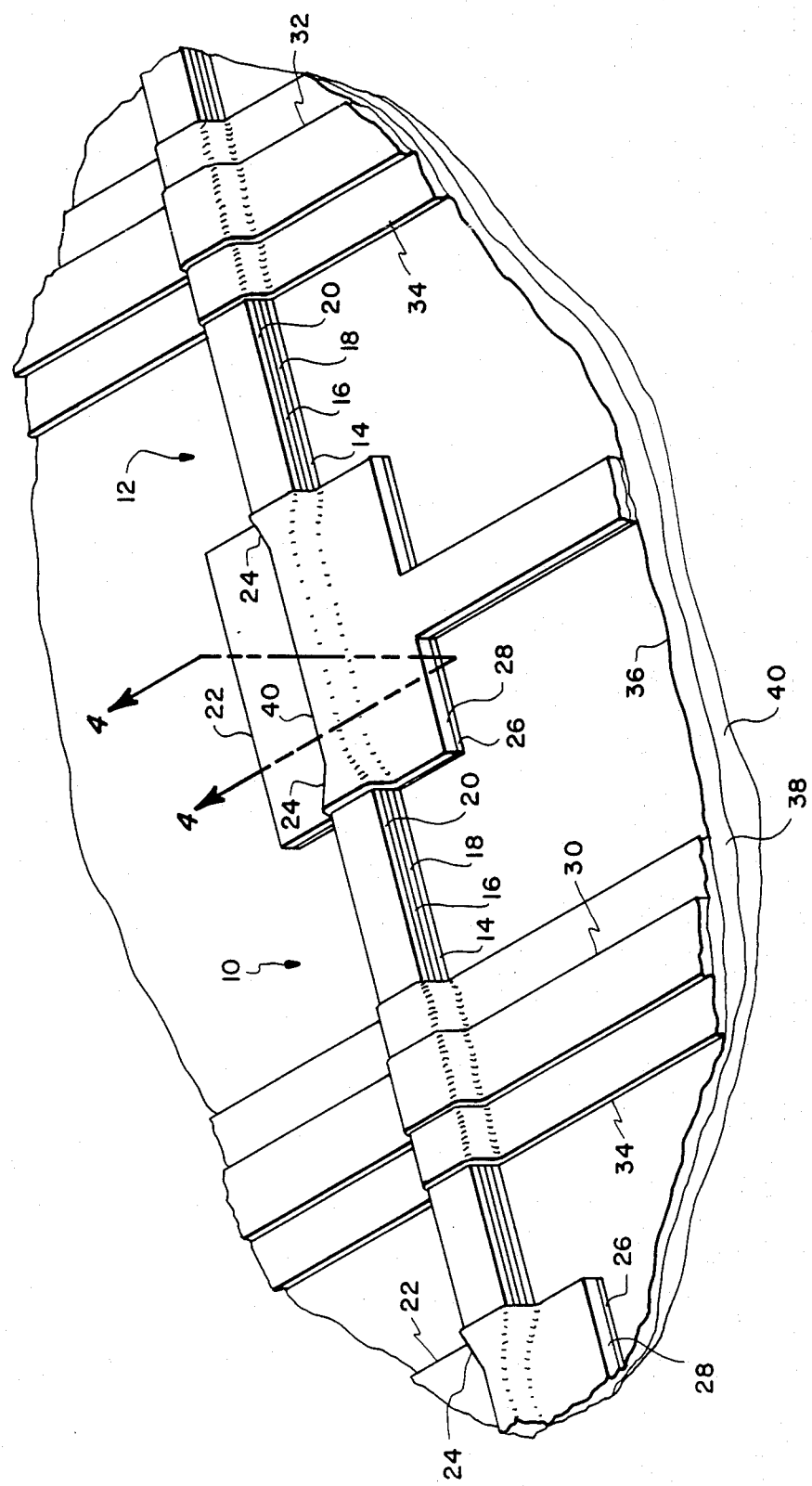
FIG. 2 is a perspective view of a portion of a second magnetic bit cell line which utilizes the present invention.

FIG. 2 depicts an alternative bit cell structure to that of FIG. 1. Corresponding structure between FIGS. 1 and 2 is like numbered. Junction contacts 22 now includes a raised channel 40 which overlays a narrowed portion of the sandwich structure (see FIG. 4B). This narrowed portion extends between cells 10 and 12. The different junction structures of FIGS. 1 and 2 are designed to avoid abrupt terminations of the sandwich structure. Abrupt terminations in the bit line concentrate magnetic free poles which generate undesirable demagnetizing fields.

Figure 3A:
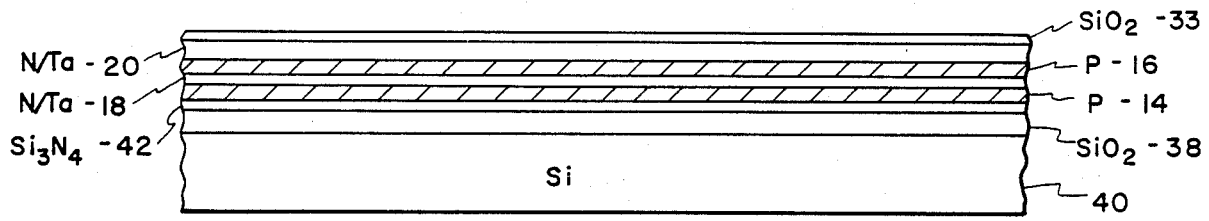
FIG. 3C is a partial sectional view along line 3—3 of FIG. 1, with FIGS. 3A and 3B showing selected sectional views of intermediate structures leading to FIG. 3C.
Figure 3B:
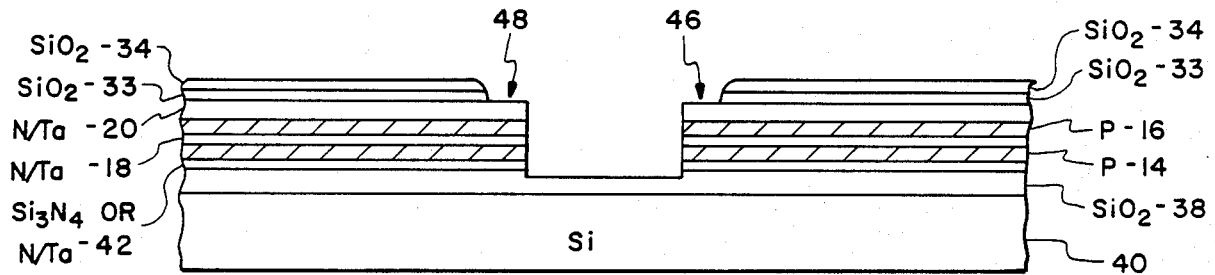
Figure 3C:
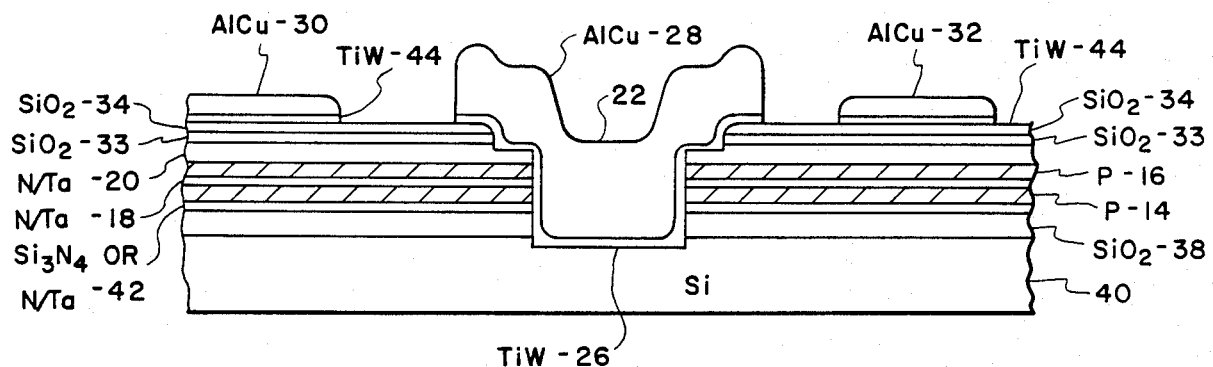

FIG. 3C is a partial, sectional view of FIG. 1. The materials indicated for the various layers and contacts are given by way of example only. Any material as herein described and claimed is suitable for the invention. Another insulating layer 42 (not shown in FIG. 1) is shown beneath layer 14. The purpose of layer 42 is to prevent oxidation of the lower magnetic layer 14. Also, word lines 30 and 32 are shown as bimetal strips including barrier metal layer 44.

Typical thickness of the various layers in FIG. 3C are as follows: $SiO_2$ layer 38, 4000 Å; $Si_3N_4$ or nitrogen doped tantalum layer 42, 200 Å; permalloy (P) layers 14 and 16, 150 Å each; nitrogen doped tantalum layer 18, 50 Å; nitrogen doped tantalum layer 20 is 500 Å except for beneath raised portions 24 where it is 100 to 200 Å; SiO₂ layer 34, 2800 Å; TiW layers 28 and 44, 1200 Å; and AlCu word lines 30 and 32, and junction contact 22, 5000 Å. Further the thickness of SiO₂ beneath junction contact 22 is 5000 to 6000 Å.

Permalloy is preferred as layers 14 and 16. In particular a compound or mixture of Ni, Fe and Co is preferred. The ratio of the materials are selected to reduce magnetostrictive effects. A ratio of 65% Ni, 15% Fe and 20% Co has been found suitable.

FIGS. 3A and 3B show intermediate solid state structures, which are formed in the course of producing the structure of FIG. 3C. Thermal oxide layer 38 is grown on substrate 40. Layers 42, 14, 18, 16 and 20 are sputtered deposited in the order listed, to complete FIG. 3A.

Insulative layer 33 in FIG. 3B is sputter deposited. Thereafter, photoresist is applied to layer 33, and the photoresist is masked and exposed to pattern the device for a first etch. A dry etch (e.g. ion milling) is performed to cut through the sandwich structure at a selected site to thereby form separate bits 10 and 12. The photoresist is stripped and oxide is sputtered, layer 34, over the entire structure. The oxide is again photomasked and etched to form vias 46 and 48, exposing the upper surface of resistive layer 20. The 500 Å resistive layer 20 serves to protect magnetic layer 16 from oxidation or other forms of attack and also serves as an etch stop to prevent the etchant from cutting into layer 16. FIG. 3B is result of these steps.

Resistive layer can be sputter etched through vias 46 and 48 to clean its surface, and immediately after layers of TiW and AlCu deposited. The metal layers are patterned and etched to form the structure in FIG. 3C. Note that the etching of vias 46 and 48, and the sputter etching of resistive layer 20 through vias 46 and 48, results in its reduced thickness at the via sites as compared to its thickness elsewhere.

Figure 4A:
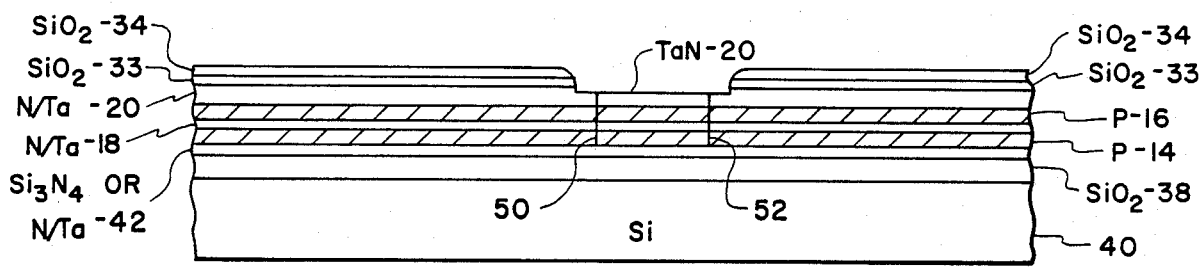
FIG. 4B is a partial sectional view along line 4—4 of FIG. 2, with FIG. 4A showing a selected sectional view of an intermediate structure leading to FIG. 4B.
Figure 4B:
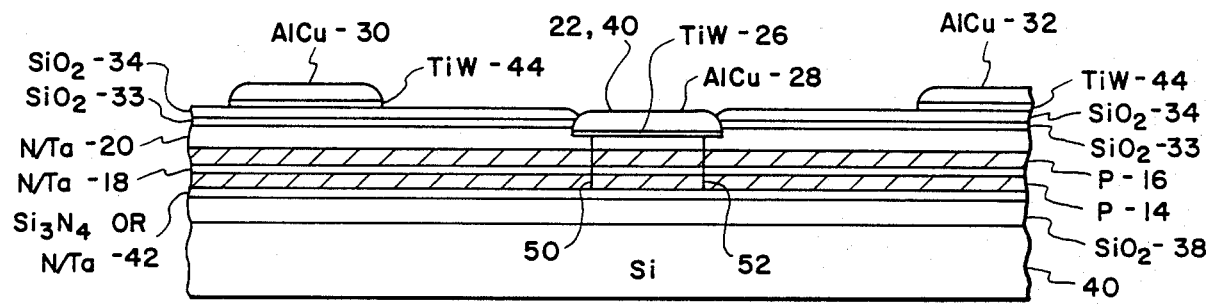

FIG. 4B depicts a partial cross section of FIG. 2. Corresponding structure between FIGS. 3C and 4B are liked numbered. Vertical lines 50 and 52 depict a generalized boundary for the narrowed portion 40 of the sandwich structure between bits 10 and 12. The thickness of the corresponding layers in FIGS. 3C and 4B are the same.

The structure of FIG. 4B is constructed by beginning with the structure of FIG. 3A, and transforming it into the structure of FIG. 4A. In FIG. 4A, oxide layers 33 and 34 has been sputtered, patterned and etched to expose the narrowed portion 40 of the bit line and expose resistive layer 20 at the bit junction site. Resistive layer 20 is sputter etched to clean it, and layers of TiW and AlCu are then deposited over the entire structure surface. The metal layers, as before, are patterned and etched to form word lines 30 and 32, and junction contact 22.

Resistive layer 20 is comprised of a material which will make good electrical contact with junction 22 and magnetic layer 16, but has a sufficiently higher resistance than magnetic layer 16 to insure that most (and at least the majority) of the sense current flowing from one end of the cell or sensor to the other, passes through the magnetoresistive layers. If the sense current were not shunted primarily through the magnetoresistive layers, the signal size of the magnetoresistive layer would not be sufficient to allow proper device performance. Further, the total resistance in the vertical direction through resistive layer 20 should not be so high as to reduce the current in the cell or sensor to below desired signal levels.

More precisely the line resistance of resistive layer 20 should be significantly more than that of the magnetoresistive layers 14 and 16, so that most of the sense current passes through the magnetoresistive layers. Also, the contact resistance of resistive layer 20, should be small as compared to the total resistance of the four layer sandwich structure, so that the added resistance due to the resistive layer does not reduce signal current to below the desired level.

The line resistance $R_l$ of resistive layer 20 is given by:

$$R_l = (\rho \times L)/(t \times W)$$

where
$\rho$ = bulk resistivity of the material
$t$ = the thickness of the layer,
$L$ = length of the layer between vias, and
$W$ = width of the film (i.e. bit line width).

The contact resistance $R_c$ is the resistance between the conductive contact and the upper magnetoresistive layer due to the presence of resistive layer 20. It can be determined per contact or per square unit of via area. $R_c$/contact is given by:

$$R_c = (\rho \times t)/(L \times W)$$

where
$\rho$ and $t$ are defined as above,
$L$ = length of the via, and
$W$ = width of the via.

The four layer sandwich structure may be viewed as the line resistance of resistive layer 20 in parallel with the line resistance of the underlying layers, and the contact resistance of the resistive layer 20 in series with the above parallel combination. Estimates of the appropriate resistance values readily follow from this model.

Additional, alternating layers of exchange coupling breaking layers and magnetoresistive layers may be added to the four layer structure. Their presence will alter the total line resistance of the underlying layers but the above analysis will still apply.

FIG. 5 is a graphical method of identifying the configuration of a suitable material for resistive layer 20 as a function of its thickness and bulk resistivity. The line marked by small circles is a line of constant contact resistance ($R_c$). The line marked by small xs is a line of constant line resistance ($R_l$). The values of $R_c$ and $R_l$ are selected as examples of typical values for cells and sensors useful with the present invention. The graph assumes permalloy layers 150 Å thick for layers 14 and 16, and an intermediate layer 18 of TaN which is 50 Å thick. Vias four square microns are assumed as contact sites. The graph shows the effect of independently varying the thickness of resistive layer 20 and the resistivity of that layer. The thickness and resistivity of layer 20 should preferably, in this example, be selected so that the result lies in the "Good" area of the graph.

Of course $R_c$ and $R_l$ of layer 20, the line resistance of layers 14, 16 and 18, and the size of the vias may all vary and affect the size and shape of the Good area on the graph.

A typical example of significant parameters of a suitable cell 10 (where the magnetic layers are permalloy) are:
via size—2 μm × 2 μm,
length of bit line between vias—20 μm, width of bit line—2 μm,
thickness of resistive layer 20—250 Å,
ρ of resistive material 20—15,000 μΩcm,
$R_c$ of material 20 at vias—0.94Ω,
$R_l$ of material 20—60,000Ω.

Further, it is preferable that resistive layer 20 be a material which does not diffuse into magnetic layer 16. If such diffusion occurs, the magnetoresistive characteristics of the cell or sensor can be greatly adversely affected, and delamination may occur between layers 18 and 20. A transition metal from the periodic table (or alloy thereof), which does not diffuse into the upper magnetic layer, is stable, and affords the appropriate resistances, is a suitable material. Further, a compound or mixture of a metal and either nitrogen or oxygen, which will not diffuse into ferromagnetic layer 16, is a good selection as resistive layer 20 because the resistivity can be tailored to the proper range.

It is also preferred that resistive material 20 be non-magnetic to avoid demagnetizing fields inherent with magnetic materials. Nitrogen doped tantalum, is a particularly useful material for layer 20. The level of nitrogen doping can be adjusted to tailor the resistivity for a particular application. The amount of nitrogen will preferably be selected so that 15 to 35 percent, by atomic concentration, of the nitrogen doped tantalum is nitrogen. Note that nitrogen doped tantalum may also be used for layers 18 and 42, and that the amount of nitrogen can be different for each of layers, 18, 20 and 42.

Preferably, one percent or less of the sense current in the bit cell will flow between contacts 24 at opposite ends of the cell through resistive layer 20. However, in some cases, up to fifty percent of the sense current will flow through resistive layer 20. Similarly, preferably the sense current will be reduced one percent or less due to the contact resistance. Again, however, in some cases, the sense current will be reduced by up to fifty percent due to the contact resistance.

Figure 6:
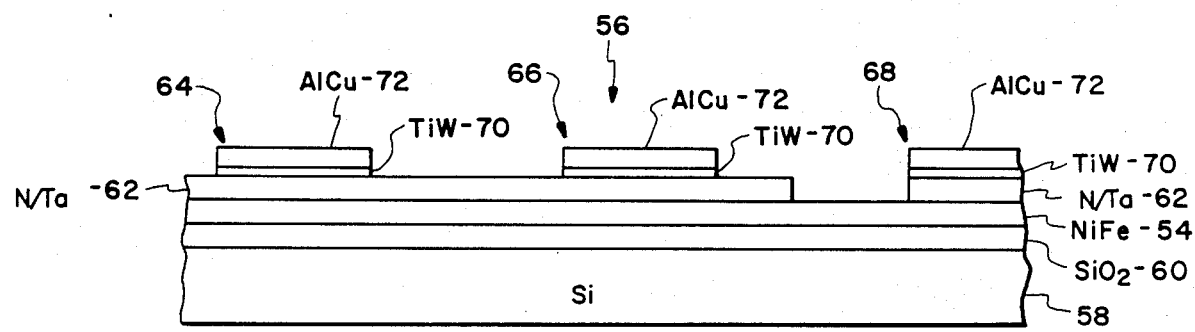
FIG. 6 is partial sectional view of a magnetic sensor structure in accordance with the present invention.

FIG. 6 depicts a further embodiment of the present invention. Therein, sensor 54 has a magnetoresistive layer 56 formed on the surface of substrate 58 (or more typically on the surface of insulative layer 60 which covers substrate 58). Resistive layer 62 overlays magnetoresistive layer 56 and serves the same functions described above (i.e. protective layer and etch stop), while not shorting out the electrical properties of layer 54.

Sensor contacts 64, 66 and 68 (again comprised of barrier metal layer 70 and conductor 72) are formed at selected sites on resistive layer 62. In operation sense current would pass, for example, between contacts 64 and 66.

Although the four layer structure of FIGS. 1 and 2 has been described above as a memory cell, the structure can be employed as a magnetic sensor also.

What is claimed is:

1. A magnetic, solid state device, wherein electrical current can flow through said device from a first to a second location, said device comprising:
   a first layer of a ferromagnetic, magnetoresistive material;
   a second layer of a ferromagnetic, magnetoresistive material;
   a third layer interposed between, and in contact with, said first and said second layers, wherein said third layer prevents exchange coupling between said first and said second layers;
   a fourth layer of a restrictive material, said fourth layer overlying, at least in part, and in contact with, said first layer, wherein said fourth layer includes nitrogen doped tantalum, wherein said first and said second locations are, at least in part, on a surface of said fourth layer with said surface being oppositely disposed from said first layer, wherein the resistivity and dimensions of said fourth layer are such that less than half of said current will flow solely within said fourth layer in passing between said first and second locations, and such that the magnitude of said current will remain above a desired signal level; and
   first and second electrical contacts connected, directly or indirectly, to said first and second locations, respectively.

2. A magnetic, solid state device, wherein electrical current can flow through said device from a first to a second location, said device comprising:
   a magnetoresistive, ferromagnetic layer;
   a resistive layer overlying, at least part of, and being in contact with, said magnetoresistive layer, wherein said first and second locations are, at least in part, on a surface of said resistive layer, said surface being oppositely disposed from said magnetoresistive layer, wherein the resistivity and dimensions of said fourth layer are such that less than half of said current will flow solely within said fourth layer in passing between said first and said second locations, and such that the magnitude of said current will remain above a desired signal level, and wherein said resistive layer includes nitrogen doped tantalum; and
   first and second electrical contacts connected, directly or indirectly, to said first and said second locations, respectively.

3. A magnetic solid state device, wherein electrical current can flow through said device from a first to a second location, said device comprising:
   a magnetoresistive, ferromagnetic layer;
   a resistive layer overlying at least in part, and being in contact with, said magnetoresistive layer, wherein said resistive layer includes nitrogen doped tantalum wherein said first and said second locations are at least in part, on a surface of said resistive layer, said surface being oppositely disposed from said magnetoresistive layer, wherein the resistivity and dimensions of said resistive layer are such that less than half of said current will flow solely within said resistive layer in passing between said first and said second locations, and such that the magnitude of said current will remain above a desired signal level, and wherein said resistive layer will not diffuse into said magnetoresistive layer; and
   first and second electrical contacts connected, directly or indirectly, to said first and said second locations, respectively.

* * * * *